United States Patent [19]

Omote et al.

[11] Patent Number: 5,541,035
[45] Date of Patent: Jul. 30, 1996

[54] METHOD OF FORMING MULTICOLOR IMAGE

[75] Inventors: Hisahiro Omote, Higashimatsuyama; Satoshi Kuwabara, Tokigawa-mura; Masahide Takano, Higashimatsuyama, all of Japan

[73] Assignee: Nippon Paper Industries Co., Ltd., Tokyo, Japan

[21] Appl. No.: 242,039

[22] Filed: May 18, 1994

Related U.S. Application Data

[63] Continuation of Ser. No. 34,410, Mar. 19, 1993, abandoned.

[30] Foreign Application Priority Data

Oct. 26, 1992 [JP] Japan ................ 4-310999

[51] Int. Cl.⁶ .................... G03F 7/26; G03C 1/805
[52] U.S. Cl. ............... 430/257; 430/143; 430/160; 430/167; 430/293
[58] Field of Search .................... 430/257, 293, 430/143, 142, 160, 167

[56] References Cited

U.S. PATENT DOCUMENTS

| | | | |
|---|---|---|---|
| 4,482,625 | 11/1984 | Namiki et al. | 430/257 |
| 4,766,053 | 8/1988 | Shinozaki et al. | 430/256 |
| 4,877,712 | 10/1989 | Namiki et al. | 430/256 |
| 5,057,394 | 10/1991 | Yabe et al. | 430/145 |
| 5,094,931 | 3/1992 | Platzer | 430/257 |
| 5,100,757 | 3/1992 | Platzer et al. | 430/143 |
| 5,273,855 | 12/1993 | Omote et al. | 430/143 |

FOREIGN PATENT DOCUMENTS 2229826  10/1990  United Kingdom.

*Primary Examiner*—John S. Y. Chu
*Attorney, Agent, or Firm*—Armstrong, Westerman, Hattori, McLeland & Naughton

[57] ABSTRACT

A method of forming a multicolored image wherein image layers etc. formed on photosensitive transfer sheets are transferred in turn onto an image-receiving sheet and then, its image layer etc. are retransferred onto a permanent supporter. Both of a transferring image layer alone and a transferring image layer and adhesive layer are used properly for photosensitive transfer sheets. The finish quality comes close to original print and the runnability becomes better when making a color proof.

1 Claim, 1 Drawing Sheet

METHOD OF FORMING MULTICOLOR IMAGE

This application is a continuation of application Ser. No. 08/034,410 filed Mar. 19, 1993, now abandoned.

BACKGROUND OF THE INVENTION

The present invention relates to a method of forming a multicolor image and materials for forming the multicolor image to be used therefor. In more detail, it relates to a forming method of a multicolor image on a color proof for proofing the color used for the proof operation in the printing plate-making process.

In the color printing, a material called a color proof for proofing color is used commonly to check the color, tone-reproduction etc. of a finished print in each operation process of plate-making.

For obtaining these materials, (1) a method wherein, prior to transferring each color image onto a desired sheet, each color image is transferred once onto a temporary image-receiving sheet provided with a photopolymerizable image-receiving layer, then they are transferred onto a desired sheet, and further the photopolymerizable image-receiving layer is hardened through the exposure of light on the overall surface (for example, Japanese Unexamined Patent Publication No. Sho 59-97410), (2) a method wherein image layers formed on transferable photosensitive materials are transferred onto an image-receiving sheet material comprising a supporter and an organic high-molecular substance provided thereon, and then the image is retransferred onto a permanent supporter (Japanese Unexamined Patent Publication No. Sho 62-27735), (3) a method wherein image layers formed on transferable photosensitive materials are transferred onto an image-receiving sheet material comprising a supporter, a first layer consisting of a first organic high-molecular substance provided thereon and a second layer consisting of a second organic high-molecular substance provided further thereon, and then the image is retransferred onto a permanent supporter (Japanese Unexamined Patent Publication No. Sho 61-189535), and (4) a method wherein image layers formed on transferable photosensitive materials are transferred onto an image-receiving sheet material having a supporter and a layer of an image-receiving layer consisting of an organic high-molecular substance provided thereon, and then the image layer alone is retransferred onto a permanent supporter (Japanese Unexamined Patent Publications No. Sho 64-52135 and No. Hei 3-21955) are known.

In the methods of (1) and (2), however, the surface having the image formed finally is covered with a layer consisting of an organic high-molecule in all cases, hence the gloss of the image surface obtained is too high, giving an impression different from the image quality after actual printing.

For this reason, for the purpose of adjusting the gloss of the image surface, a method wherein a matted sheet having a roughened surface and the image surface formed on the permanent supporter are superposed and treatments such as pressurizing and heating are given to alter the surface gloss of the image is also used, but there are problems in the runnability that the operation of this method is troublesome by itself, many types of matted sheets are required to achieve the aimed gloss, and the like.

Moreover, the layer covering the image surface and consisting of the organic high-molecule makes the optical dot gain higher than that of the actual print, leading to the tone reproduction different from the print.

Next, with respect to the method (3), this method has such advantages that, when the second layer of said image-receiving sheet is transferred onto the permanent supporter together with an image layer, said layer is buried adapting to the irregularities of the surface of the permanent supporter, thus giving a good adhesion to the permanent supporter, and also, after the supporter of the image-receiving sheet was peeled off, the matting process is not required. But, because of the existence of the layer covering the image surface and consisting of the organic high-molecule similarly, the optical dot gain becomes higher than that of actual print, leading to the tone reproduction different from the print.

On the contrary, in the method (4), the image-receiving sheet having one layer of the image-receiving layer is used, and, when retransferring, the image layer alone is transferred from the image-receiving layer onto the permanent supporter, hence the quality of proof becomes close to the quality of actual print.

In this method, however, when transferring the image layer on the image-receiving sheet onto the permanent supporter such as paper, if the image-receiving layer of the image-receiving sheet and the permanent supporter contact directly, for example, if the image-receiving layer is thick enough to have a cushioning property, then the image layer is buried into the image-receiving layer, tending to directly contact the image-receiving layer with the permanent supporter. In this case, the adhesive force of both is too strong and, when peeling off the image-receiving sheet, the phenomena such as picking takes place, limiting the type of paper usable as a permanent supporter. Moreover, in the transferring operation, some knacks are needed on peeling off the image-receiving sheet finally. These and others have problems in the runnability.

The invention therefore aims at obtaining such a color proof material that the final matting process of the surface of the proof is not required, phenomena such as picking do not take place on peeling off the image-receiving sheet after transferring the image layers on the image-receiving sheet onto the permanent supporter such as paper, special knacks are not needed also on peeling off the image-receiving sheet, and color proof is close to the print with good runnability.

SUMMARY OF THE INVENTION

Said purpose has been accomplished by a method of forming a multicolor image characterized in that, in the forming method of multicolor image wherein, using a photosensitive transfer sheet C1 coated with a release layer permitting a colored photosensitive layer to be peelable and a colored photosensitive layer in turn onto a supporter, a photosensitive transfer sheet C2 coated with a release layer permitting a thermosensitive adhesive layer to be peelable, a thermosensitive adhesive layer and a colored photosensitive layer in turn onto a supporter, and an image-receiving sheet having an image-receiving layer on a supporter, image layers of n sheets of photosensitive transfer sheets are transferred in turn onto the image-receiving sheet, then the overall image layers are retransferred onto a permanent supporter (material to be transferred ultimately) (hereinafter, in the invention, permanent supporter and material to be transferred ultimately are used in the same meaning), and thereafter the image-receiving sheet is peeled off, the photosensitive transfer sheets of the constitution of the photosensitive transfer sheet C1 are used for the first sheet to the (n−1)th sheet and the photosensitive transfer sheet of the constitution of photosensitive transfer sheet C2 is used only for the last nth sheet.

BRIEF DESCRIPTION OF THE DRAWING

FIGS. 1(A)–(G) show the method of the invention schematically step by step, wherein FIG. 1(A) is a schematic diagram of a photosensitive transfer sheet C1 after exposure and development, FIG. 1(B) is a schematic diagram of a photosensitive transfer sheet C2 after exposure and development, FIG. 1(C) is a schematic diagram of image-receiving sheet (primer treatment layer is omitted), FIG. 1(D) is an illustration diagram showing the step that the colored image layer of the photosensitive transfer sheet C1 is transferred onto the image-receiving sheet and the supporter is peeled off, FIG. 1(E) is an illustration diagram showing the step that three colored image layers of the photosensitive transfer sheets C1 have been transferred onto the image-receiving sheet, FIG. 1(F) is an illustration diagram showing the step that the colored image layer and the adhesive layer of the photosensitive transfer sheet C2 are transferred onto the image-receiving layer and the supporter is peeled off, and FIG. 1(C) is an illustration diagram showing the step that the colored image layers and the adhesive layer on the image-receiving sheet are transferred finally onto the material to be transferred ultimately and the image-receiving sheet is peeled off.

Figure 1A:
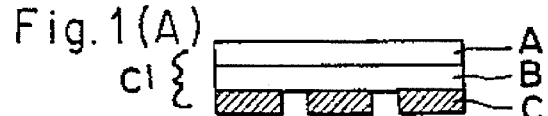
Figure 1B:
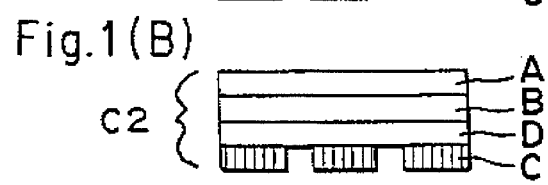
Figure 1C:
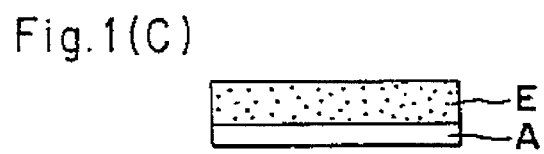
Figure 1D:
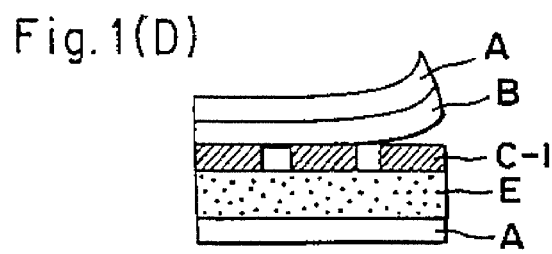
Figure 1E:
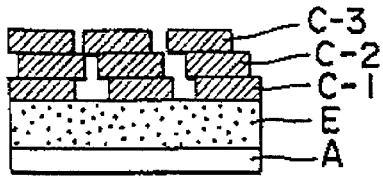
Figure 1F:
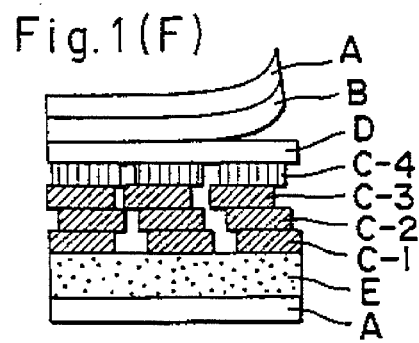
Figure 1G:
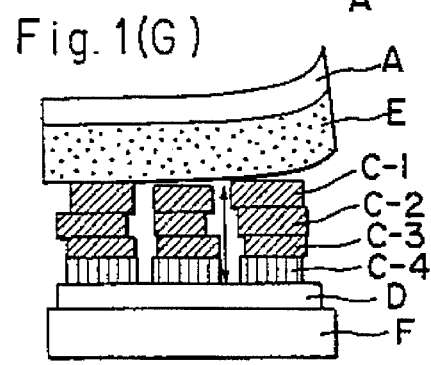

The explanation of alphabets is as follows:

A Transparent supporter of photosensitive transfer sheets C1 and C2 and image-receiving sheet, B Release layer of photosensitive transfer sheets C1 and C2, C Colored image layer of photosensitive transfer sheets C1 and C2 (marked as C-1, C-2, . . . in order of transfer), D Adhesive layer of photosensitive transfer sheet C2, E Image-receiving layer of image-receiving sheet, and F Material to be transferred ultimately (paper etc.)

DETAILED DESCRIPTION OF THE INVENTION

In following, the invention will be illustrated in more detail.

For the photosensitive transfer sheet and the image-receiving sheet to be used in the invention, transparent supporters are used. As the transparent supporters, publicly known conventional plastic films are utilized. For example, transparent plastic films such as poly(ethylene terephthalate), polypropylene, polyethylene, poly(vinyl chloride), polystyrene, polycarbonate and triacetate can be mentioned. In particular, biaxially stretched poly(ethylene terephthalate) film is excellent in the strength, heat resistance, dimensional stability, transparency, economics, etc., thus it is preferable. The thickness of transparent supporter is not restricted particularly, but preferable to be about 50 to 150 μm from the point of runnability.

Next, the photosensitive transfer sheet to be used in the invention will be illustrated.

The photosensitive transfer sheet to be used in the invention includes two types of constitutions, which are called here as photosensitive transfer sheets C1 and C2 for convenience.

The photosensitive transfer sheet C1 has a constitution that a release layer permitting a colored photosensitive layer to be peelable and a colored photosensitive layer are coated in turn onto said supporter. Also, the photosensitive transfer sheet C2 has a constitution that a release layer a permitting thermosensitive adhesive layer to be peelable, a thermosensitive adhesive layer and a colored photosensitive layer are coated in turn onto a similar supporter.

For the substances to form the release layer of photosensitive transfer sheets C1 and C2, styrene-maleic anhydride resin, polyester resin, acrylic resin, melamine resin, vinylidene chloride resin, etc. are suitable, and they are used each independently or in mixtures.

The thickness of the release layer is preferable to be 0.1 to 10 μm, in particular, 1.0 to 3.0 μm.

Moreover, the surface of release layer may be given with a matting (roughening) treatment, if need be. As the method, a matting agent is added into the release layer.

The matting agents to be used for such purpose include inorganic particles such as silicon dioxide, calcium carbonate and alumina and fine particles of plastic powders such as polyethylene, polypropylene, poly(ethylene terephthalate), polystyrene, polycarbonate, acrylic ester resin, methacrylic acid resin, polyacrylonitrile and acrylonitrile copolymers, or the like. The particle size of the matting agent is suitable to be 0.01 to 10 μm, and the type of matting agent, particle size and addition level can be controlled depending on the degree of matting.

Next, with respect to the thermosensitive adhesive layer of the photosensitive transfer sheet C2, for the substances to form this layer, for example, the following film-forming high-molecular substances can be mentioned.

Poly(acrylic ester) and acrylic ester copolymers, poly(methacrylic ester) and methacrylic ester copolymers, polyacrylamide and acrylamide copolymers, poly(vinyl chloride) and vinyl chloride copolymers, poly(vinylidene chloride) and vinylidene chloride copolymers, polystyrene and styrene copolymers, ethylene copolymers such as ethylene and vinyl acetate, ethylene and acrylic ester, ethylene and vinyl chloride and ethylene and acrylic acid, poly(vinyl acetal)s such as poly(vinyl butyral) and poly(vinyl formal), polyester resin, polyamide resins such as nylon and copolymerized nylon, various rubbers such as synthetic rubbers and chlorinated rubber, polyolefins such as polyethylene and polypropylene, cellulose derivatives, shellac, and various waxes.

In addition to these, mutual mixtures of these high-molecular substances or mixed systems of these with other substances such as other high-molecular substances, plasticizers and supercooled substances can also be used. For example, combinations of even such ones that have the adhesiveness at room temperature with other substances capable of preventing said adhesiveness or combinations of even such ones that exhibit no adhesiveness on heating with adhesiveness-affording substances, plasticizers or the like are also conceivable. Hence, not only single substances but also various combinations depending on the type of supporters etc., if need be, are conceivable, and, for this reason, the adhesive layer is not necessarily restricted to the substances aforementioned.

For laminating the thermosensitive adhesive layer onto the release layer, the solution of said high-molecular substances is coated onto the supporter by the usual method and dried, or said high-molecular substances in solid state may be coated after hot melting (hot melt coating). The thickness of adhesive layer is preferable to be not less than 1 μm, desirably 2 to 10 μm.

The substances to form the colored photosensitive layer of the transfer sheets C1 and C2 are not particularly restricted to positive type, negative type or the like, but, from the point of thermal adhesiveness of colored photosensitive layer, the colored photosensitive layers comprising positive type photosensitive compositions described in Japanese Unexamined Patent Publications No. Sho 63-311349, No. Hei 1-180540 and No. Hei 2-308253 are preferable. These positive type colored photosensitive layers utilize a phenomenon to obtain positive type photosensitive compositions applying conventional negative type photosensitive compositions, and, in the development process, water or warm water alone is used and the chemicals such as organic solvent and alkali are not used at all.

The mechanism of the image formation is that the photosensitive layer in the area exposed to light through a positive manuscript is removed easily because it is insolubilized to water and swollen by water, and, in the photosensitive layer in the area nonexposed to light, water-soluble photosensitive components such as water-soluble photocrosslinking agent and water-soluble resin dissolve out by water, but the synthetic resin emulsion and coloring agent are left behind as they are, to form an image.

Description will be made about this image formation of photosensitive layer in more detail. In order to clarify the features of this photosensitive a layer, such layer that a composition of water-soluble photosensitive component, synthetic resin emulsion and coloring agent is coated onto the supporter and the coated layer has been heated and dried to form a film is defined as the photosensitive layer.

○ Exposed area

The water-soluble photosensitive component in the photosensitive layer exposed to actinic light is insolubilized to water. And, when dipping into water, this photo-crosslinking component swells easily to soften the photo-sensitive layer in this area. It also decreases the adhesion to the supporter. Hence, by rubbing with a sponge or the like, this area is removed easily from supporter.

○ Nonexposed area

When dipping into water, the greater part of the water-soluble photosensitive component in the photosensitive layer is dissolved out, but the photosensitive layer does not show the changes such as swelling and softening and the adhesion to supporter also does not change. Hence, it is not removed from supporter even if rubbing with a sponge. Moreover, the greater part of water-soluble photosensitive component in the photosensitive layer is dissolved out. Hence, this photosensitive layer becomes a layer formed by the film formation of the synthetic resin emulsion alone containing coloring agent. That is to say, since the photosensitive layer in this nonexposed area corresponds to the image area, the image layer is a layer formed by the film formation of the synthetic resin emulsion alone containing the coloring agent.

The synthetic resin emulsion to be mixed in said colored photosensitive liquor of photosensitive transfer sheet used in the invention has a glass transition temperature of −20° to −40° C. and is selected from any of poly(acrylic ester), copolymers of acrylic ester, copolymer of ethylene and vinyl acetate and copolymers containing ethylene and vinyl acetate or any mixtures of these. Hence, this image layer formed through the exposure and development treatment is to have the thermal adhesiveness by itself.

In following, explanation will be made about the water-soluble photosensitive layer used for this colored photosensitive layer.

The water-soluble photosensitive component includes (1) one comprising a water-soluble photocrosslinking agent and a water-soluble resin and (2) one comprising a water-soluble resin having a photosensitive component-adding group.

First, the water-soluble photocrosslinking agent and the water-soluble resin under (1) will be explained. For the water-soluble photocrosslinking agents, publicly known organic photosensitive substances such as water-soluble azide compound, diazonium salt, tetrazonium salt and others can be used. Here, some examples will be mentioned.

Water-soluble azide compound

Sodium 4,4'-diazidostilbene-2,2'-disulfonate
Sodium 4'-azido-4-azidobenzalacetophenone-2-sulfonate
Sodium 4,4'-diazidostilbene-α-carboxylate
Sodium di-(4-azido-2'-hydroxybenzal)acetone-2-sulfonate
Sodium 4-azidobenzalacetophenone-2-sulfonate Diazo resin Condensate of p-diazodiphenylamine with formaldehyde Tetrazonium salt Diphenyl-4,4'-bis-diazonium chloride.zinc chloride double salt
3,3'-Dimethyldiphenyl-4,4'-bis-diazonium chloride.zinc chloride double salt
3,3'-Dimethoxydimethyl-4,4'-bis-diazonium chloride.zinc chloride double salt
Diphenylamine-4,4'-bis-diazonium chloride.zinc chloride double salt
Diphenylmethane-4,4'-bis-diazonium chloride.zinc chloride double salt.

As the water-soluble resins, a lot of substances including polyacrylamide, poly(vinyl pyrrolidone), graft polymer of poly(vinyl alcohol) with vinyl monomer, water-soluble poly(vinyl butyral), glue, casein, gelatin, arabic gum, egg albumin, gums, alginic acids, poly(ethylene oxide), poly-(acrylic acid) and its salts, poly(methacrylic acid) and its salts, or mixtures of these, and further mixtures of these with poly(vinyl alcohol) or cellulose derivatives such as carboxymethyl cellulose and hydroxymethylcellulose can be mentioned.

Secondly, the water-soluble resin having photosensitive component-adding group under (2) will be explained. The water-soluble resins having photosensitive component are water-soluble high-molecules having at least one kind selected from stilbazolium group and stilquinolium group represented by following general formulae (I) and (II)

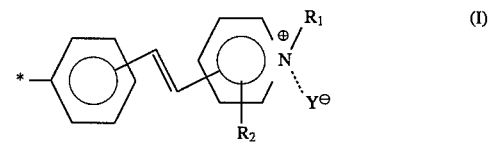

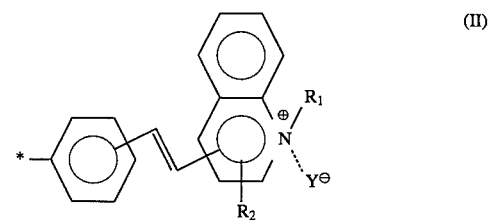

(wherein $R_1$ and $R_2$ denote each independently hydrogen atom or alkyl group, $Y^{\ominus}$ denotes a conjugate basic ion of acid, and * denotes a linking position to link with water-soluble high-molecule via linking group), as photosensitive component-adding group(s). As said water-soluble resins, a lot of substances including poly(vinyl alcohol), polyacrylamide, poly(vinyl pyrrolidone), gelatin, casein, egg albumin, arabic gum, and mixtures of these can be mentioned.

Moreover, the addition rate of the photosensitive component-adding group to these water-soluble resins is desirable to be 0.2 to 5.0 mol %. If less than this level, sufficient insolubilization to water will not take place, and, if more, the compatibility with synthetic resin emulsion will often become poor. These can be produced by the methods described in Japanese Patent Publications No. Sho 56-5761 and No. Sho 56-5762, Japanese Unexamined Patent Publications No. Sho 56-11906 and No. Sho 62-239145, etc.

Next, the synthetic resin emulsion to be used will be explained.

As the synthetic resin emulsions, a lot of substances having a glass transition temperature of $-20°$ to $-40°$ C. including poly(acrylic ester), copolymer of ethylene and vinyl acetate, poly(vinyl chloride), polyurethane, poly(vinyl chloride), and copolymers and mixtures of these can be mentioned.

Further, to these, conventionally known water-dispersible colored pigments, water-soluble dyes, leveling agents, stabilizers, etc. can be added, if need be.

Moreover, the solids formulation ratio of said synthetic resin emulsion to aforementioned water-soluble resin is 1/99 to 80/20, more preferably 5/95 to 40/60. If the water-soluble resin is too much, the water resistance of image will decrease to drop out the image on development. Inversely, if the synthetic resin emulsion is too much, the developability will decrease. If out of said range markedly, the image will not be obtained.

Moreover, the solids formulation ratio of water-soluble phostocrosslinking agent to the sum of water-soluble resin and synthetic resin emulsion is 98/2 to 70/30, more preferably 96/4 to 80/20. If the water-soluble photocrosslinking agent is less than this level, the sensitivity and the image quality will decrease remarkably and, inversely, if too much, decreased image quality will result. If out of said range markedly, the image will not be obtained.

Further, the coloring agent is preferable to be added in amounts of not more than 20% in the case of colored pigment and not more than 10% in the case of water-soluble dye to the sum of solids of water-soluble photocrosslinking agent, water-soluble resin and synthetic resin emulsion. Said components to constitute the photosensitive composition are prepared by dissolving or dispersing into water, water/alcohol mixed liquor or the like.

In following, explanation will be made about the image-receiving sheet to be used in the invention.

For the image-receiving sheet used in the invention, one described in Japanese Patent Application No. Hei 3-173156 is preferable, so its constitution will be illustrated.

It is possible to form the image-receiving layer of image-receiving sheet directly on the supporter, but, preferably, it is desirable to form it on a supporter provided with primer treatment.

As the resins to form the primer treatment layer, polyester, polyurethane, ethylene-vinyl acetate copolymer, acrylic ester-styrene copolymer, etc. can be utilized, but the utilization of polyurethane obtainable by crosslinking isocyanate and acrylic polyol is most preferable.

When providing the primer treatment layer, the coating mode is not particularly restricted and it needs not to mind which conventionally known method may be employed.

Moreover, the thickness of layer is preferable to be about 0.3 to 3.0 μm.

The image-receiving layer of image-receiving sheet comprises a sole resin crosslinked the molecules of copolymer of olefin and $\alpha,\beta$-unsaturated carboxylic acid with metallic ions or a mixture of it with a resin consisting of a copolymer of ethylene and vinyl acetate.

The forming method of the sole layer of this resin crosslinked the molecules of copolymer of olefin and $\alpha,\beta$-unsaturated carboxylic acid with metallic ions or the mixed layer of it with the resin consisting of copolymer of ethylene and vinyl acetate includes a method wherein these resins are molten by heating and mixed resins are coated onto the supporter by extrusion and a method wherein individual resin dispersed into water is mixed and the mixture is coated onto the supporter and dried to form the layer. For the image-receiving layer used in the invention, the forming method is not restricted.

Next, as the monomers for olefin to form the image-receiving layer, ethylene, propylene, 1-butene, 1-pentene, 1-hexene, 4-methyl-1-pentene, 1-octene, isobutylene, etc. can be utilized.

The $\alpha,\beta$-unsaturated carboxylic acid being a polymerizable monomer to form the image-receiving layer has usually around 2 to 8 carbon atoms, and, for example, acrylic acid, methacrylic acid, $\alpha$-ethyleneacrylic acid, maleic acid, monomethyl maleate, itaconic acid, etc. can be mentioned. Moreover, in place of these $\alpha,\beta$-unsaturated carboxylic acids, their esters, methyl acrylate, ethyl acrylate, methyl methacrylate, n-butyl methacrylate, dimethyl fumarate, diethyl itaconate, dimethyl maleate, etc. can be used.

Each one kind or not less than two kinds in combination of said polymerizable monomers, olefins and $\alpha,\beta$-unsaturated carboxylic acids or their esters may be used.

As the metallic ions for crosslinking the molecules of copolymer of olefin and $\alpha,\beta$-unsaturated carboxylic acid to form the image-receiving layer, zinc, magnesium, etc. can be utilized in addition to alkali metals such as lithium, sodium and potassium.

Moreover, the copolymerization rate of olefin to $\alpha,\beta$-unsaturated carboxylic acid in this resin crosslinked with the molecules of copolymer of olefin and $\alpha,\beta$-unsaturated carboxylic acid with metallic ions is preferable to be not less than 50%. This is because of that, at the addition under 50%, the excellent features of improved thermal adhesiveness with image, improved peelability from transferred image and nontransferring onto heated and pressurized rolls utilizing on transfer obtainable by adding the resin crosslinked with the molecules of copolymer of olefin and $\alpha,\beta$-unsaturated carboxylic acid with metallic ions to the resin consisting of copolymer of ethylene and vinyl acetate become not to be seen.

Further, the crosslinking degree with metallic ion of the resin crosslinked with the molecules of copolymer of olefin and $\alpha,\beta$-unsaturated carboxylic acid with metallic ions is preferable to be 20 to 65%.

At the crosslinking degree under 20%, the excellent features of improved thermal adhesiveness with image, improved peelability from transferred image and non-transferring onto heated and pressurized rolls utilizing on transfer become not to be seen, similarly to said case of the copolymerization rate of olefin to $\alpha,\beta$-unsaturated carboxylic acid in the resin crosslinked with the molecules of copolymer of olefin and $\alpha,\beta$-unsaturated carboxylic acid with metallic ions.

Also, if the crosslinking degree exceeds 65%, the image-receiving layer will be liable to undergo the influence of moisture in the environment, and, in particular, when the coated film has absorbed the moisture significantly, the thermal adhesiveness with image and the peelability from the transferred image will be reduced.

The manufacturing method itself of this resin crosslinked with the molecules of copolymer of olefin and $\alpha,\beta$-unsaturated carboxylic acid with metallic ions is well known and the methods described in, for example, Japanese Patent Publication No. Sho 39-6810, Japanese Unexamined Patent Publication No. Sho 49-121891, etc. can be adopted. Moreover, as the water-dispersing method of this resin, methods described in Japanese Unexamined Patent Publications No. Sho 51-62890, No. Sho 55-98242, etc. can be utilized.

The weight ratio of ethylene to vinyl acetate in the resin consisting of copolymer of ethylene and vinyl acetate used for the image-receiving layer is preferable to be 95/5 to 65/35. If the weight ratio of vinyl acetate is lower than this range, sufficient thermal adhesiveness will not be obtained, and, if higher than this range, the tackiness will result to make the positioning operation on image transfer, etc. difficult.

Moreover, the constitution of the image-receiving layer is determined by a balance between adhesiveness and peelability, and the constitution of the mixture of resin crosslinked with the molecules of copolymer of olefin and $\alpha,\beta$-unsaturated carboxylic acid with metallic ions with resin consisting of copolymer of ethylene and vinyl acetate is selected from the weight proportion from 100/0 to 10/90.

The thickness of this image-receiving layer of image-receiving sheet is required to be higher than the sum of the thickness of all image layers having been transferred and the depth of irregularities in the surface of the material to be transferred ultimately (permanent supporter), but, if too thick, there results in a drawback to make the registering accuracy on superposing the images with respective color poor. Usually, when selecting the printing text paper for material to be transferred ultimately, the thickness of the image-receiving layer is preferable to be selected from a range of 15 to 150 μm.

In following, the procedure for making usual color proof by the forming method of multicolor image will be illustrated, using the materials as described above.

1. The photosensitive transfer sheets of yellow, magenta and black having the constitution of photosensitive transfer sheet C1 and the photosensitive transfer sheet of cyan having the constitution of photosensitive transfer sheet C2 are superposed with respective positive type manuscripts, exposed to actinic light (usually, ultraviolet rays), dipped into warm water (for 30 to 60 sec in water of 40° to 50° C.), and developed by rubbing to form the color-separated images of four colors.

2. The color-separated image is superposed on the image-receiving layer of the image-receiving sheet, the image layer of color-separated image is laminated onto the image-receiving layer by passing through two heated and pressurized rolls, and, after cooling, the transparent supporter of photosensitive transfer sheet is peeled off to remove. For example, when the photosensitive transfer sheet for cyan is made one having the constitution of photosensitive transfer sheet C2, the transferring order at this time is selected from (yellow→magenta→black→cyan), (yellow→black→magenta→cyan), (magenta→yellow→black→cyan), (magenta→black→yellow→cyan), (black→yellow→magenta→cyan) and (black→magenta→yellow→cyan), and one having the constitution of photosensitive transfer sheet C2 comes last.

It is desirable to set the heating temperature of the roll at 80° to 130° C., and to apply a pressure of 1.0 to 6.0 kgf/cm² from both ends of the rolls.

3. All the color-separated image layers having been transferred onto the image-receiving sheet are laminated with the material to be transferred ultimately and, after cooling, the image-receiving sheet is peeled off to form a multicolor image on the material to be transferred ultimately.

The method of the invention is a forming method of multicolor image wherein, using a photosensitive transfer sheet C1 coated with a release layer permitting colored photosensitive layer to be peelable and a colored photosensitive layer in turn onto a supporter, a photosensitive transfer sheet C2 coated with a release layer permitting thermosensitive adhesive layer to be peelable, a thermosensitive adhesive layer and a colored photosensitive layer in turn onto a supporter, and an image-receiving sheet having an image-receiving layer on a supporter, image layers of n sheets of the photosensitive transfer sheet are transferred in turn onto the image-receiving sheet, then the overall image layers are retransferred onto a permanent supporter, and thereafter the image-receiving sheet is peeled off, and the photosensitive transfer sheets of the constitution of photosensitive transfer sheet C1 are used for the first sheet to the (n−1)th sheet and the photosensitive transfer sheet of the constitution of photosensitive transfer sheet C2 is used only for the last nth sheet, thereby transferring the image on the image-receiving layer of image-receiving sheet onto a permanent supporter such as paper. Thereafter, when peeling off the image-receiving sheet, no problems such as picking generate. Hence, special knacks are not required on peeling off the image-receiving sheet, making the operativity better.

Moreover, the finally finished proof does not produce unnecessary gloss since nothing is transferred onto the surface of image to cover. Hence, even without the matting treatment, the similarity to print is not injured, allowing to obtain an excellent color proof.

In following, the invention will be illustrated more concretely based on the examples, but the invention is not confined to the examples below.

Besides, part in the invention means part by weight and means % by weight.

| 1. (Release layer-forming liquor for photosensitive transfer sheets C1 and C2) | |
|---|---|
| Release layer-forming liquor A | |
| Saturated polyester (30% solution) (Thermolac F-1: made by Soken Kagaku K.K.) | 49 parts |
| Acrylic ester-melamine copolymer (40% solution) (Tespeel TA51-824A: made by Hitachi Chemical Polymer Co., Ltd.) | 0.75 parts |
| p-Toluenesulfonic acid (50% solution) | 0.25 parts |
| Toluene | 20 parts |
| Methyl ethyl ketone | 20 parts |
| Cyclohexanone | 10 parts |
| Release layer-forming liquor B | |
| Styrene-maleic anhydride resin (100%) (Styrene HS-1: made by Daido Kogyo Co., Ltd.) | 10 parts |
| Saturated polyester (30% solution) (Thermolac F-1: made by Soken Kagaku K.K.) | 30 parts |
| Methanol | 40 parts |
| Toluene | 40 parts |
| Release layer-forming liquor C | |
| Vinylidene chloride (40% solution) (Kurehalon SOA: made by Kureha Chemical Industry Co., Ltd.) | 7.5 parts |
| Acrylic ester-melamine copolymer (40% solution) (Tespeel TA51-824A: made by Hitachi Chemical Polymer Co., Ltd.) | 20 parts |
| p-Toluenesulfonic acid (50% solution) | 1.5 parts |

| | |
|---|---|
| Toluene | 30 parts |
| Methyl ethyl ketone | 30 parts |
| Cyclohexanone | 11 parts |

2. (Colored pphotosensitive layer-forming liquor for photo sensitive transfer sheets C1 and C2)

Colored photosensitive layer-forming liquor A

| | |
|---|---|
| Sodium 4,4'-diazidostilbene-2,2'-disulfonate | 2.1 parts |
| Poly(vinyl pyrrolidone)(45% solution) (PVP K-60: made by General Anilin & Film Co.) | 4 parts |
| Poly(acrylic ester) emulsion (46% liquor) (Primal B-15: made by Nihon Acrylic Chemical Co., Ltd.) | 15.6 parts |
| Dispersion of colored pigment | 5 parts |
| Methanol | 20 parts |
| Water | 53.3 parts |

Colored photosensitive layer-forming liquor B

| | |
|---|---|
| Condensate of p-diazodiphenylamine with formaldehyde | 2 parts |
| Polyacrylamide (10% solution) (polymerization degree 10000: made by Nakarai Kagaku) | 22.5 parts |
| Copolymer of ethylene and vinyl acetate (50% liquor) (Sumikaflex-751: made by Sumitomo Chemical Co., Ltd.) | 13.5 parts |
| Dispersion of colored pigment | 5 parts |
| Methanol | 20 parts |
| Water | 37 parts |

Colored photosensitive layer-forming liquor C

| | |
|---|---|
| Sodium 4,4'-diazidostilbene-2,2'-disulfonate | 1.2 parts |
| Poly(vinyl pyrrolidone)(45% solution) (PVP K-60: made by General Anilin & Film Co.) | 3 parts |
| Copolymer of ethylene and vinyl acetate (50% liquor) (Sumikaflex-702: made by Sumitomo Chemical Co., Ltd.) | 15.3 parts |
| Dispersion of colored pigment | 5 parts |
| Methanol | 20 parts |
| Water | 55.5 parts |

Colored photosensitive layer-forming liquor D

| | |
|---|---|
| Stilbazolium group-introduced poly(vinyl alcohol) (introduced 1.25 mol % of N-methylstilbazolium group, av. polymerization degree 1700, saponification degree 88%, 10% solution) | 18.6 parts |
| Poly(acrylic ester) emulsion (46% liquor) (Primal B-15: made by Nihon Acrylic Chemical Co., Ltd.) | 15.7 parts |
| Dispersion of colored pigment | 5 parts |
| Methanol | 30.4 parts |
| Water | 30.4 parts |

Besides, the dispersion of colored pigments to be used in said colored photosensitive layer-forming liquors can be obtained by dispersing in following formulation with ink mill.

| | |
|---|---|
| Pigment | 60 parts |
| Hydroxypropylmethylcellulose (Metholose 60SH4000: made by Shin-Etsu Chemical Co., Ltd.) | 10 parts |
| Nonionic surfactant (polyethyleneglycol alkylphenyl ether) | 1 part |
| Water | 229 parts |

*As the pigments, black:carbon black, yellow:Permanent Yellow HR, magenta:Permanent Carmine FB and cyan:Phthalocyanine Blue were used.

3. (Adhesive layer of photosensitive transfer sheet C2)

Adhesive layer-forming liquor

| | |
|---|---|
| Polyester resin (34% liquor) (Vironal MD-1200: made by Toyobo Co., Ltd.) | 30 parts |
| Isopropyl Alcohol | 35 parts |
| Water | 35 parts |

4. (Primer treatment layer-forming liquor for image-receiving sheet)

| | |
|---|---|
| Acrylic polyol (50% liquor) (Thermolac U-245B: made by Soken Kagaku K.K.) | 45 parts |
| Isocyanate (75% liquor) (Takenate D-110N: made by Takeda Chemical Industries, Ltd.) | 20 parts |
| Silica (Mizukasil SK-7: made by Mizusawa Industrial Chemicals Ltd.) | 5 parts |
| Toluene | 100 parts |
| Ethyl acetate | 100 parts |
| Ethyl cellosolve | 50 parts |

5. (Image-receiving layer-forming liquor for image-receiving sheet)

Image-receiving layer-forming liquor A
(Water dispersion of resin crosslinked the molecules of copolymer of olefin and $\alpha,\beta$-unsaturated carboxylic acid with metallic ions)
25% Water dispersion comprising:

Olefin: ethylene $\alpha,\beta$-Unsaturated carboxylic acid: methacrylic acid

Metallic ion: sodium

Copolymerization ratio of olefin to $\alpha,\beta$-unsaturated carboxylic acid: 85/15

Crosslinking degree: 35%

(Water dispersion of resin consisting of copolymer of ethylene and vinyl acetate)
35% Water dispersion comprising:

Copolymerization ratio of ethylene to vinyl acetate: 85/15

Melt index: 150

Solids mixing ratio of (water dispersion of resin crosslinked with the molecules of copolymer of olefin and $\alpha,\beta$-unsaturated carboxylic acid with metallic ions) to (water dispersion of resin consisting of copolymer of ethylene and vinyl acetate): 20/80

Image-receiving layer-forming liquor B
(Water-dispersion of resin crosslinked with the molecules of copolymer of olefin and $\alpha,\beta$-unsaturated carboxylic acid with metallic ions)
25% Water dispersion comprising:

Olefin: ethylene $\alpha,\beta$-Unsaturated carboxylic acid: methacrylic acid

Metallic ion: sodium

Copolymerization ratio of olefin to $\alpha,\beta$-unsaturated carboxylic acid: 85/15

Crosslinking degree: 35%

(Water dispersion of resin consisting of copolymer of ethylene and vinyl acetate)
35% Water dispersion comprising:

Copolymerization ratio of ethylene to vinyl acetate: 85/15

Melt index: 150

Solids mixing ratio of (water dispersion of resin crosslinked with the molecules of copolymer of olefin and $\alpha,\beta$-unsaturated carboxylic acid with metallic ions) to (water dispersion of resin consisting of copolymer of ethylene and vinyl acetate) 50/50

Image-receiving layer-forming liquor C
(Water dispersion of resin crosslinked with the molecules of copolymer of olefin and $\alpha,\beta$-unsaturated carboxylic acid with metallic ions)
25% Water dispersion comprising:

Olefin: ethylene $\alpha,\beta$-Unsaturated carboxylic acid: methacrylic acid

Metallic ion: sodium

Copolymerization ratio of olefin to $\alpha,\beta$-unsaturated carboxylic acid: 85/15

Crosslinking degree: 35%

Solids mixing ratio of (water dispersion of resin crosslinked with the molecules of copolymer of olefin and α,β-unsaturated carboxylic acid with metallic ions) to (water dispersion of resin consisting of copolymer of ethylene and vinyl acetate): 100/0

EXAMPLE 1

(Preparative method of photosensitive transfer sheet C1)

Using the release layer-forming liquor A, a release layer with a dried thickness of 2 μm was coated onto a 100 μm thick biaxially stretched poly(ethylene terephthalate) film. Further, using the colored photosensitive layer-forming liquor A (dispersed pigment is black), a colored photosensitive layer with a dried thickness of 2 μm was coated onto the release layer to prepare the photosensitive transfer sheet C1 for black.

Similarly, varying the dispersed pigment in the colored photosensitive layer-forming liquor A, photosensitive transfer sheets C1 for yellow and magenta were prepared.

(Preparative method of photosensitive transfer sheet C2)

Using the release layer-forming liquor A, a release layer with a dried thickness of 2 μm was coated onto a 100 μm thick biaxially stretched poly(ethylene terephthalate) film. Further, using the adhesive layer-forming liquor, an adhesive layer with a dried thickness of 2 m was coated onto the release layer. Still more, using the colored photosensitive layer-forming liquor A (dispersed pigment is cyan), a colored photosensitive layer with a dried thickness of 2 μm was coated onto the adhesive layer to prepare the photosensitive transfer sheet C2 for cyan.

These 4 sheets of the photosensitive transfer sheet were superposed with color-decomposed positive films corresponding to respective colors and proper exposure (transmitting through the second gradation of continuous tone keil in Ugra offset inspection keil) was given by an ultra high-pressure mercury lamp. After dipped into warm water of 40° C., all were rubbed with a sponge to obtain 4 transfer sheets of black, yellow, magenta and cyan.

(Preparative method of image-receiving sheet)

Using the primer treatment layer-forming liquor for the image-receiving sheet, a primer layer with a dried thickness of 2 μm was formed on one side of a 125 μm thick biaxially stretched poly(ethylene terephthalate) film, the side having been subjected to corona discharge treatment beforehand.

Using the image-receiving layer-forming liquor A, an image-receiving layer with a dried thickness of 80 μm was formed on the primer layer to obtain an image-receiving sheet.

Following this, the black image surface of photosensitive transfer sheet C1 having the image already formed is superposed with the image-receiving layer of this image-receiving sheet and passed through two heated and pressurized rolls (120° C., 4.0 kgf/cm$^2$), thereby laminating a black image layer onto the image-receiving layer, and, after cooling, the transparent supporter of photosensitive transfer sheet C1 is peeled off together with the release layer.

By this procedure, the black image layer alone is transferred onto the image-receiving layer. Further, remaining color-separated images are transferred in order of yellow, magenta and cyan onto the image-receiving layer having the black image layer transferred in turn by the similar procedure. In this case, for yellow and magenta, the image layer alone is transferred and, for cyan, the adhesive layer is also transferred together with image layer.

Finally, the surface of a 4-color image layer and the adhesive layer transferred onto the image-receiving layer of this image-receiving sheet is superposed with coated paper (SK coat, 105 g/m$^2$ made by Sanyo-Kokusaku Pulp Co., Ltd.) as a material to be transferred ultimately and passed through two heated and pressurized rolls (120° C., 4.0 kgf/cm$^2$), thereby laminating all of the image layers and the adhesive layer having been transferred onto the image-receiving layer onto coated paper. After cooling, by peeling off the image-receiving sheet together with the image-receiving layer, adhesive layer, cyan image layer, magenta image layer, yellow image layer and black image layer are transferred completely in order from bottom onto the coated paper, leading to the formation of the multicolor image.

This color proof thus finished was very close to the print in hue as well as color and its image surface had no excessive gloss not requiring the matting treatment. Besides, when peeling off the image-receiving sheet from paper after transfer, no peeling defects such as picking were caused, showing good peelability.

EXAMPLE 2

(Preparative method of photosensitive transfer sheets C1 and C2)

Using a similar supporter to Example 1 and the release layer-forming liquor B and colored photosensitive layer-forming liquor B, photosensitive transfer sheets C1 for black, yellow and magenta were obtained. Also, using a similar supporter to Example 1 and the release layer-forming liquor B, adhesive layer-forming liquor and colored photosensitive layer forming liquor B, a photosensitive transfer sheet C2 for cyan was obtained.

Successively, similar exposure and development to Example 1 were carried out to obtain 4 transfer sheets.

(Preparative method of image-receiving sheet)

Using a similar supporter to Example 1 and the primer treatment layer-forming liquor and image-receiving layer-forming liquor B, an image-receiving sheet having 100 μm thick image-receiving layer was obtained.

Using said materials, a multicolor image was formed on a coated paper by the similar method to Example 1.

In this case, too, similarly to Example 1, the matting treatment of the image surface was not required and the similarity to print was good. Moreover, when peeling off the image-receiving sheet from paper, no peeling defects such as picking were caused, showing good peelability.

EXAMPLE 3

(Preparative method of photosensitive transfer sheets C1 and C2)

Using a similar supporter to Example 1 and the release layer-forming liquor C and colored photosensitive layer-forming liquor C, photosensitive transfer sheets C1 for black, yellow and magenta were obtained. Also, using a similar supporter to Example 1 and the release layer-forming liquor C1, adhesive layer-forming liquor and colored photosensitive layer-forming liquor C, a photosensitive transfer sheet C2 for cyan was obtained.

Successively, similar exposure and development to Example 1 were carried out to obtain 4 transfer sheets.

(Preparative method of image-receiving sheet)

Using a similar supporter to Example 1 and the primer treatment layer-forming liquor and image-receiving layer-forming liquor C, an image-receiving sheet having 120 μm thick image-receiving layer was obtained.

Using said materials, a multicolor image was formed on a coated paper by the similar method to Example 1.

In this case, too, similarly to Example 1, the matting treatment of the image surface was not required and the similarity to print was good. Moreover, when peeling off the image-receiving sheet from paper, no peeling defects such as picking were caused, showing good peelability.

EXAMPLE 4

(Preparative method of photosensitive transfer sheets C1 and C2)

Using a similar supporter to Example 1 and the release layer-forming liquor A and colored photosensitive layer-forming liquor D, photosensitive transfer sheets C1 for black, yellow and magenta were obtained. Also, using a similar supporter to Example 1 and the release layer-forming liquor A, adhesive layer-forming liquor and colored photosensitive layer-forming liquor D, photosensitive transfer sheet C2 for cyan was obtained.

Successively, similar exposure and development to Example 1 were carried out to obtain 4 transfer sheets.
(Preparative method of image-receiving sheet)

Using a similar supporter to Example 1 and the primer treatment layer-forming liquor and image-receiving layer-forming liquor C, an image-receiving sheet having 100 μm thick image-receiving layer was obtained.

Using said materials, a multicolor image was formed on a coated paper by the similar method to Example 1.

In this case, too, similarly to Example 1, the matting treatment of the image surface was not required and the similarity to print was good. Moreover, when peeling off the image-receiving sheet from paper, no peeling defects such as picking were caused, showing good peelability.

EXAMPLE 5

(Preparative method of photosensitive transfer sheets C1 and C2)

Using a similar supporter to Example 1 and the release layer-forming liquor C and colored photosensitive layer-forming liquor B, photosensitive transfer sheets C1 for black, yellow and magenta were obtained. Also, using a similar supporter to Example 1 and the release layer-forming liquor C, adhesive layer-forming liquor and colored photosensitive layer-forming liquor B, a photosensitive transfer sheet C2 for cyan was obtained.

Successively, similar exposure and development to Example 1 were carried out to obtain 4 transfer sheets.
(Preparative method of image-receiving sheet)

Using a similar supporter to Example 1 and the primer treatment layer-forming liquor and image-receiving layer-forming liquor A, an image-receiving sheet having an 80 μm thick image-receiving layer was obtained.

Using said materials, a multicolor image was formed on a coated paper by the similar method to Example 1.

In this case, too, similarly to Example 1, the matting treatment of image surface was not required and the similarity to print was good. Moreover, when peeling off the image-receiving sheet from paper, no peeling defects such as picking were caused, showing good peelability.

COMPARATIVE EXAMPLE 1

(Preparative method of photosensitive transfer sheet)

Using the following release layer-forming liquor D and thermosensitive adhesive layer-forming liquor, a 2 μm thick release layer and a 2.5 μm thick thermosensitive adhesive layer thereon were formed in turn on a 100 μm thick biaxially stretched poly(ethylene terephthalate) film.

| Release layer-forming liquor D | |
| --- | --- |
| Acrylic ester melamine copolymer (40% solution) (Tespeel TA51-824A: made by Hitachi Chemical Polymer Co., Ltd.) | 2 parts |
| Vinyl chloride-vinyl propionate copolymer (40% solution) (Ryulon Qu-628: made by Tosoh Corp.) | 35 parts |
| p-Toluenesulfonic acid | 1.5 parts |
| Silica (Mizukasil SK-7: made by Mizusawa Industrial Chemicals Ltd.) | 2 parts |
| Toluene | 25 parts |
| Methyl ethyl ketone | 25 parts |
| Cyclohexanone | 10 parts |
| Adhesive layer-forming liquor | |
| Polyester resin (30% liquor) (Vironal MA-14: made by Toyobo Co., Ltd.) | 20 parts |
| Isopropyl alcohol | 40 parts |
| Water | 40 parts |

Next, using said colored photosensitive layer-forming liquor C, a colored photosensitive layer was formed on this thermosensitive adhesive layer. By this method, 4 sheets of photosensitive transfer sheets for black, yellow, magenta and cyan were obtained.

The exposure and the development were carried out by the same methods as in Example 1, respectively, to obtain 4 transfer sheets.
(Preparative method of image-receiving sheet)

Using said release layer-forming liquor D and the thermosensitive adhesive layer-forming liquor, a 2 μm thick release layer and an 8 μm thick thermosensitive adhesive layer thereon were formed in turn on a 125 μm thick biaxially stretched poly(ethylene terephthalate) film to prepare an image-receiving sheet, in which this thermosensitive adhesive layer serves as an image-receiving layer.

Following this, the black image surface of the photosensitive transfer sheet having the image already formed is superposed with the image-receiving layer (thermosensitive adhesive layer) of this image-receiving sheet and passed through two heated and pressurized rolls (120° C., 4.0 kgf/cm$^2$), thereby laminating a black image layer onto the image-receiving layer (thermosensitive adhesive layer), and, after cooling, the transparent supporter of the photosensitive transfer sheet is peeled off together with the release layer. In this case, the image layer of the photosensitive transfer sheet and the thermosensitive adhesive layer are transferred together onto the image-receiving sheet.

Further, remaining color-separated images are transferred in order of yellow, magenta and cyan onto the black image layer and its thermosensitive adhesive layer already transferred in turn by the similar procedure. In this case, too, for the yellow, yellow image layer and its thermosensitive adhesive layer are to be transferred together and, for the magenta, magenta image layer and its thermosensitive adhesive layer.

Finally, the surface of the 4-color image layer and the thermosensitive adhesive layer transferred accompanying therewith transferred onto the image-receiving layer (thermosensitive adhesive layer) of this image-receiving sheet is superposed with coated paper (SK coat, 105 g/m$^2$: made by Sanyo-Kokusaku Pulp Co., Ltd.) as a material to be transferred ultimately and passed through two heated and pressuized rolls (120° C., 4.0 kgf/cm$^2$), thereby laminating all of the image layers and the thermosensitive adhesive layers transferred accompanying therewith transferred onto the image-receiving layer (thermo-sensitive adhesive layer) of the image-receiving sheet with the coated paper. After cooling, by peeling off the transparent supporter of image-receiving sheet together with its release layers, 4-color image layers, thermosensitive adhesive layer accompanying therewith and an image-receiving layer (thermo-sensitive adhesive layer) of image-receiving sheet are transferred onto a coated paper. By this method, a multicolor image was formed on the coated paper and then the image-receiving sheet was peeled off.

The color proof prepared by this method caused no problems such as picking when peeling off the image-receiving sheet finally, but unnecessary gloss was produced on the image surface of the finished color proof, showing a different finish from the print.

COMPARATIVE EXAMPLE 2

(Preparative method of photosensitive transfer sheet)

Using a similar supporter to Example 1 and the release layer-forming liquor B and colored photosensitive layer-forming liquor B, 4 photosensitive transfer sheets C1 for black, yellow, magenta and cyan were obtained.

Successively, similar exposure and development to Example 1 were carried out to obtain 4 transfer sheets.
(Preparative method of image-receiving sheet)

Using a similar supporter to Example 1 and the primer treatment layer-forming liquor and image-receiving layer-forming liquor B, an image-receiving sheet having 100 μm thick image-receiving layer was obtained.

Using said materials, a multicolor image was formed on a coated paper by the similar method to Example 1 and then the image-receiving sheet was peeled off.

The color proof prepared by this method had no unnecessary gloss on its image surface and the matting treatment was not required, but the picking was caused when peeling off the image-receiving sheet finally.

What is claimed is:

1. A method of forming a multicolor image, comprising:

(a) preparing a photosensitive transfer sheet C1 consisting essentially of a colored photosensitive layer, a release layer and a supporter;

(b) forming a color-separated image on the photosensitive transfer sheet C1;

(c) transferring the color-separated image onto an image-receiving sheet comprised of a thermosensitive adhesive layer and a supporter;

(d) peeling the supporter with the release layer from the transferred color-separated image;

(e) repeating steps (a) and (b);

(f) transferring the color-separated image obtained from step (e) onto a previously transferred color-separated image;

(g) peeling the supporter with the release layer from the color-separated image transferred in step (f);

(h) optionally repeating steps (e)–(g) one or more times;

(i) preparing a photosensitive transfer sheet C2 comprised of a colored photosensitive layer, a thermosensitive adhesive layer, a release layer and a supporter;

(j) forming a color-separated image on the photosensitive transfer sheet C2;

(k) transferring the color-separated image obtained from step (j) onto the previously transferred color-separated image;

(l) peeling the supporter with the release layer from the photosensitive transfer sheet C2 transferred in step (k);

(m) transferring the remaining color-separated images and thermosensitive adhesive layer of step (l) onto a permanent supporter; and (n) peeling the image-receiving sheet from the first transferred color-separated image, thereby obtaining a multicolor image.

* * * * *